(12) United States Patent
Yokoyama et al.

(10) Patent No.: US 10,490,433 B2
(45) Date of Patent: Nov. 26, 2019

(54) SUBSTRATE STORING CONTAINER

(71) Applicant: MIRAIAL CO., LTD., Tokyo (JP)

(72) Inventors: Makoto Yokoyama, Tokyo (JP); Kouji Kubota, Tokyo (JP); Arisa Sasaki, Tokyo (JP)

(73) Assignee: MIRAIAL CO., LTD, Tokyo (JP)

( * ) Notice: Subject to any disclaimer, the term of this patent is extended or adjusted under 35 U.S.C. 154(b) by 0 days.

(21) Appl. No.: 15/737,949

(22) PCT Filed: Jul. 3, 2015

(86) PCT No.: PCT/JP2015/069348
§ 371 (c)(1),
(2) Date: Dec. 19, 2017

(87) PCT Pub. No.: WO2017/006406
PCT Pub. Date: Jan. 12, 2017

(65) Prior Publication Data
US 2018/0182655 A1    Jun. 28, 2018

(51) Int. Cl.
*H01L 21/673* (2006.01)
*H01L 21/677* (2006.01)

(52) U.S. Cl.
CPC .. *H01L 21/67383* (2013.01); *H01L 21/67369* (2013.01); *H01L 21/67373* (2013.01); *H01L 21/67386* (2013.01); *H01L 21/67376* (2013.01); *H01L 21/67772* (2013.01)

(58) Field of Classification Search
CPC ......... H01L 21/67383; H01L 21/67369; H01L 21/67373; H01L 21/67386; H01L 21/67376

USPC .......................................... 206/710, 711, 454
See application file for complete search history.

(56) References Cited

U.S. PATENT DOCUMENTS 7,823,730 B2 * 11/2010 Mimura ............ H01L 21/67369
                                                 206/454
8,453,842 B2 *  6/2013 Inoue ................ H01L 21/67386
                                                 206/454
2012/0043254 A1   2/2012 Inoue

FOREIGN PATENT DOCUMENTS

| JP | 2005-005525 A | 1/2005 |
|----|---------------|--------|
| JP | 4338617 B2 | 10/2009 |
| WO | WO 2010/131291 A1 | 11/2012 |
| WO | WO 2013/025629 A2 | 2/2013 |
| WO | WO 2014/136247 A1 | 9/2014 |

* cited by examiner

*Primary Examiner* — Steven A. Reynolds
(74) *Attorney, Agent, or Firm* — Muncy, Geissler, Olds & Lowe, P.C.

(57) ABSTRACT

The plurality of protective grooves 225 has openings 2231 wider than thicknesses of the edge portions of the substrates W to allow the edge portions of the substrates W to be inserted. The edge portions of the substrates W are inserted into the protective grooves 225 in a non-contact state in which a space is formed between the edge portions of the substrates W and a groove forming surface 2221 of the substrate edge portion protective portion 222 on which the protective grooves 225 are formed when the container main body opening portion is closed by the lid body and the edge portions of the substrates W are not in contact with the groove forming surface 2221.

6 Claims, 4 Drawing Sheets

SUBSTRATE STORING CONTAINER

TECHNICAL FIELD

The present invention relates to a substrate storing container which is used when a substrate made of a semiconductor wafer, etc. is stored, kept, conveyed, or transported.

BACKGROUND ART

As a substrate storing container for storing and conveying a substrate made of a semiconductor wafer, one has been known conventionally that has a configuration including a container main body and a lid body.

The container main body has a tubular wall portion in which a container main body opening portion is formed at one edge portion, and in which the other edge portion is closed. A substrate storing space is formed in the container main body. The substrate storing space is formed by being surrounded by the wall portion and can store a plurality of substrates. The lid body is removably attached to the container main body opening portion and can close the container main body opening portion.

A front retainer is provided at a portion of the lid body corresponding to a portion facing the substrate storing space when the container main body opening portion is closed. When the container main body opening portion is closed by the lid body, the front retainer can support edge portions of a plurality of substrates. In addition, a rear retainer is provided at the wall portion so as to form a pair with the front retainer. The rear retainer can support edge portions of a plurality of substrates. When the container main body opening portion is closed by the lid body, the rear retainer holds a plurality of substrates in a state in which adjacent substrates are arranged in parallel to be spaced by a predetermined interval by supporting the plurality of substrates in cooperation with the front retainer. The rear retainer has a plurality of grooves recessed in a direction away from the substrate storing space (for example, see Patent Document 1). In addition, there is a known configuration in which a portion of the rear retainer forming the grooves is elastically deformable, and a portion of the rear retainer supporting rear ends of the substrates is not elastically deformable (see Patent Document 2).

In the conventional substrate storing container described in the above publication, when the container main body opening portion is closed by the lid body and the substrates stored in the substrate storing space are conveyed, ends of the substrates abut on the rear retainer at all times. For this reason, particles are likely to be generated between the substrates and the rear retainer. When the substrate storing container receives an impact during conveyance of the substrates by the substrate storing container, the ends of the substrates slide against the rear retainer and particles are more likely to be generated.

Therefore, there is a known substrate storing container in which the ends of the substrates are not in contact and generation of particles is suppressed when the substrate storing container does not receive an impact during conveyance of the substrates by the substrate storing container and a wafer protective groove is included to protect the substrates when the substrate storing container receives an impact (see Patent Document 3).

Patent Document 1: Japanese Patent No. 4338617
Patent Document 2: Japanese Unexamined Patent Application, Publication No. 2005-5525
Patent Document 3: PCT International Publication No. WO2013/025629

DISCLOSURE OF THE INVENTION

Problems to be Solved by the Invention

In recent years, there is a demand not only for suppression of generation of particles, and but also for further protection of the substrates against the impact on the substrate storing container. In addition, there is a high demand for suppression of generation of a so-called cross slot with which a substrate supported at a predetermined position of the rear retainer leaves the predetermined position, moves to a position adjacent to the predetermined position, and is inserted and disposed due to the impact on the substrate storing container.

An object of the invention is to provide a substrate storing container capable of suppressing generation of particles, protecting substrates from an impact on the substrate storing container, and suppressing generation of a cross slot.

Means for Solving the Problems

The invention relates to a substrate storing container including a container main body having a tubular wall portion in which a container main body opening portion is formed at one edge portion and the other edge portion is closed, a substrate storing space which is allowed to store a plurality of substrates and communicates with the container main body opening portion being formed by an inner face of the wall portion, a lid body removably attached to the container main body opening portion and allowed to close the container main body opening portion, a lid body side substrate support portion disposed at a portion of the lid body facing the substrate storing space when the container main body opening portion is closed by the lid body and allowed to support edge portions of the plurality of substrates when the container main body opening portion is closed by the lid body, a back side substrate support portion disposed to form a pair with the lid body side substrate support portion in the substrate storing space and allowed to support the edge portions of the plurality of substrates, the back side substrate support portion supporting the plurality of substrates in a state in which the edge portions of the plurality of substrates are arranged in parallel in cooperation with the lid body side substrate support portion when the container main body opening portion is closed by the lid body, and a substrate edge portion protective portion in which a plurality of protective grooves having openings wider than thicknesses of the edge portions of the substrates to allow insertion of the edge portions of the substrates is formed, the edge portions of the plurality of substrates being inserted into the plurality of protective grooves one by one at least when the container main body opening portion is closed by the lid body, wherein the edge portions of the substrates are inserted into the protective grooves in a non-contact state in which a space is formed between the edge portions of the substrates and the groove forming surface of the substrate edge portion protective portion on which the protective grooves are formed when the container main body opening portion is closed by the lid body and the edge portions of the substrates are not in contact with the groove forming surface.

In addition, it is preferable that the substrate storing container further includes a lateral substrate support portion disposed to form a pair in the substrate storing space and allowed to support the edge portions of the plurality of substrates in a state in which adjacent substrates among the plurality of substrates are arranged in parallel to be spaced by a predetermined interval when the container main body opening portion is not closed by the lid body, wherein the protective grooves have depths at which the edge portions of the substrates are not inserted into the protective grooves when the container main body opening portion is not closed by the lid body and the edge portions of the plurality of substrates are supported by the lateral substrate support portion and the edge portions of the substrates are inserted into the protective grooves when the container main body opening portion is closed by the lid body.

In addition, it is preferable that each of the substrates has a front surface on which a device is formed and a back surface with respect to the front surface, the groove forming surface has a front surface facing surface portion facing the front surface in a direction connecting the front surface and the back surface when the container main body opening portion is closed by the lid body, and a back surface facing surface portion facing the back surface in a direction connecting the front surface and the back surface when the container main body opening portion is closed by the lid body, and a shortest distance from the front surface to the front surface facing surface portion is longer than a shortest distance from the back surface to the back surface facing surface portion.

In addition, it is preferable that the front surface facing surface portion and the back surface facing surface portion are included in at least a pair of inclines inclined such that each of the openings of each of the protective grooves widens from a bottom portion of the protective groove toward the opening, when an angle between one of the front surface and the back surface of the substrate and the front surface facing surface portion is set to a, and an angle between the one surface of the substrate and the back surface facing surface portion is set to b, a relation of a>b is satisfied, and the edge portions of the substrates face bottom portions of the protective grooves on a radially outer side of the substrates when the container main body opening portion is closed by the lid body.

In addition, it is preferable that the lid body side substrate support portion is allowed to elastically displaced by a predetermined displacement amount in a direction from the other edge portion to the one edge portion of the container main body when the container main body opening portion is closed by the lid body, and the protective grooves have depths at which the edge portions of the substrates are inserted into the protective grooves by an amount greater than or equal to the predetermined displacement amount in a direction from the one edge portion to the other edge portion of the container main body when the container main body opening portion is closed by the lid body. In addition, it is preferable that the substrate edge portion protective portion has elasticity.

Effects of the Invention

According to the invention, it is possible to provide a substrate storing container capable of suppressing generation of particles, protecting substrates from an impact on the substrate storing container, and suppressing generation of a cross slot.

PREFERRED MODE FOR CARRYING OUT THE INVENTION

Figure 1:
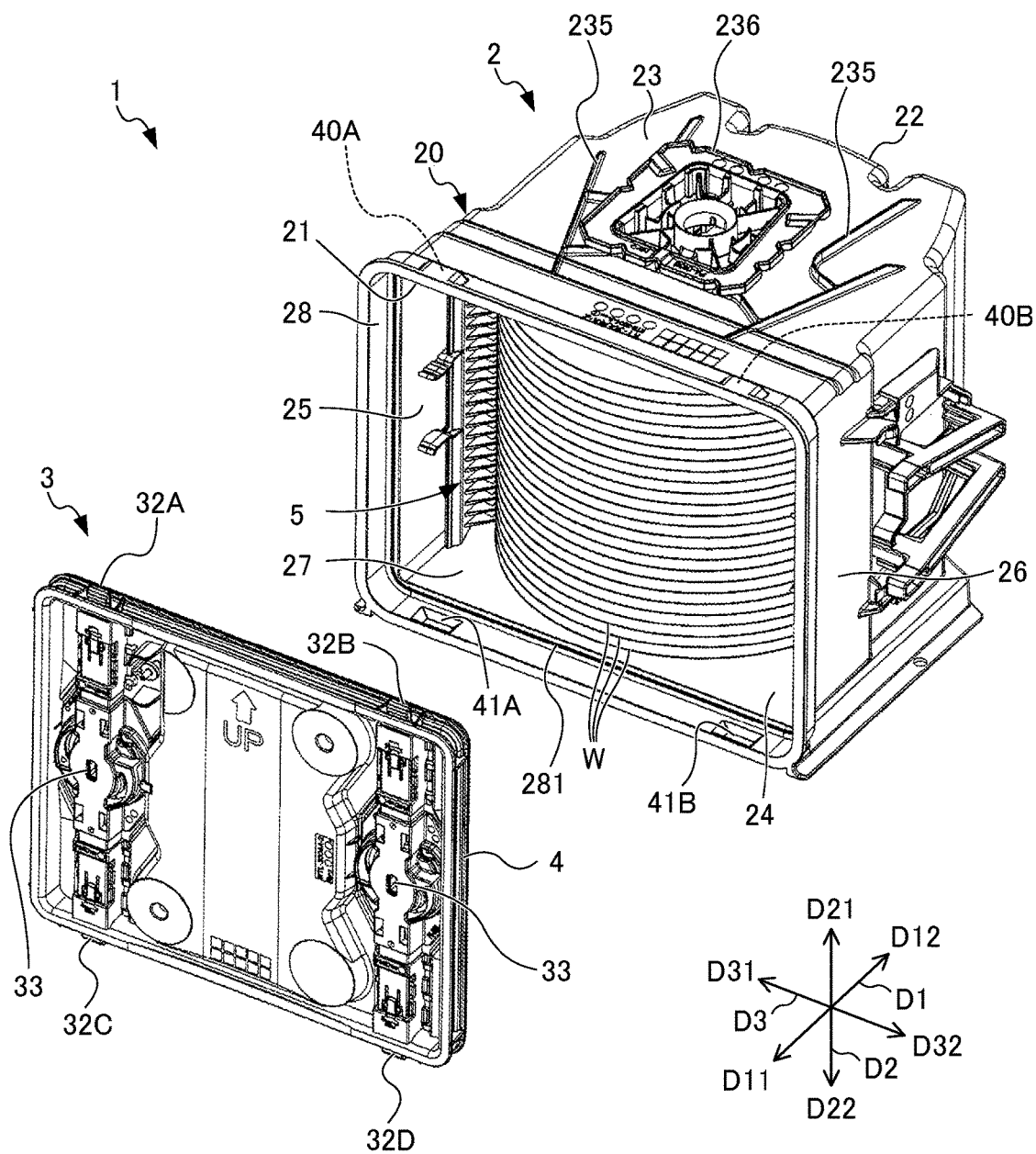
FIG. 1 is an exploded perspective view illustrating a state in which a substrate W is stored in a substrate storing container 1 according to a first embodiment of the invention.
Figure 2:
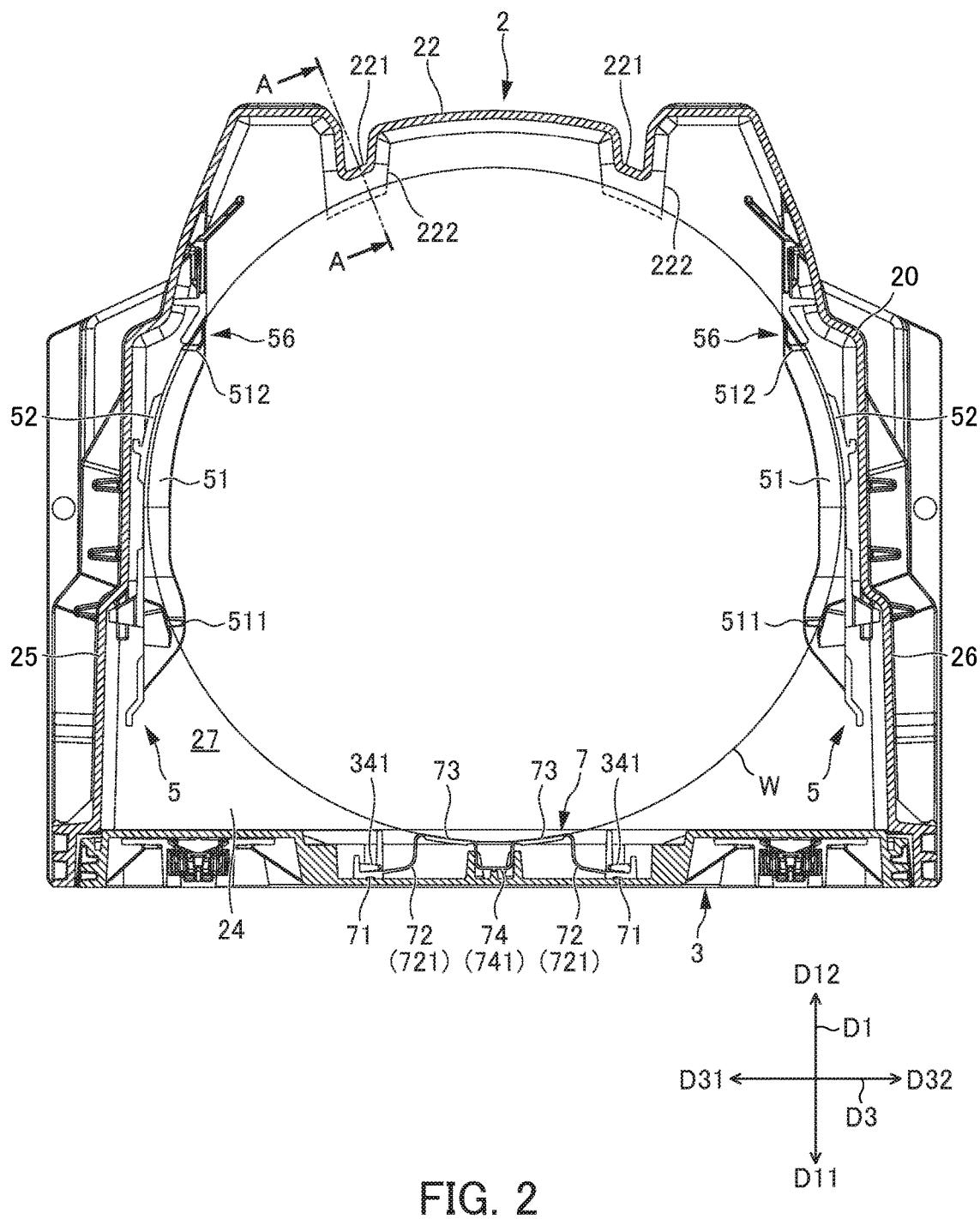
FIG. 2 is a planar cross-sectional view illustrating a positional relationship between the substrate storing container 1 and the substrate W according to the first embodiment of the invention.
Figure 3:
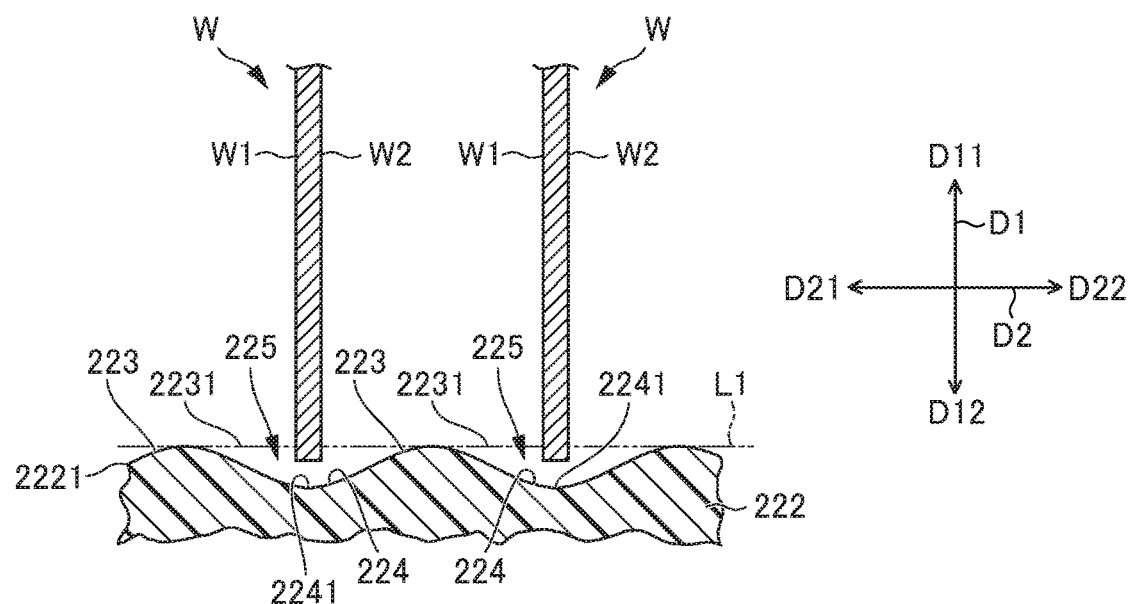
FIG. 3 is an enlarged cross-sectional view taken along A-A line of FIG. 2.
Figure 4:
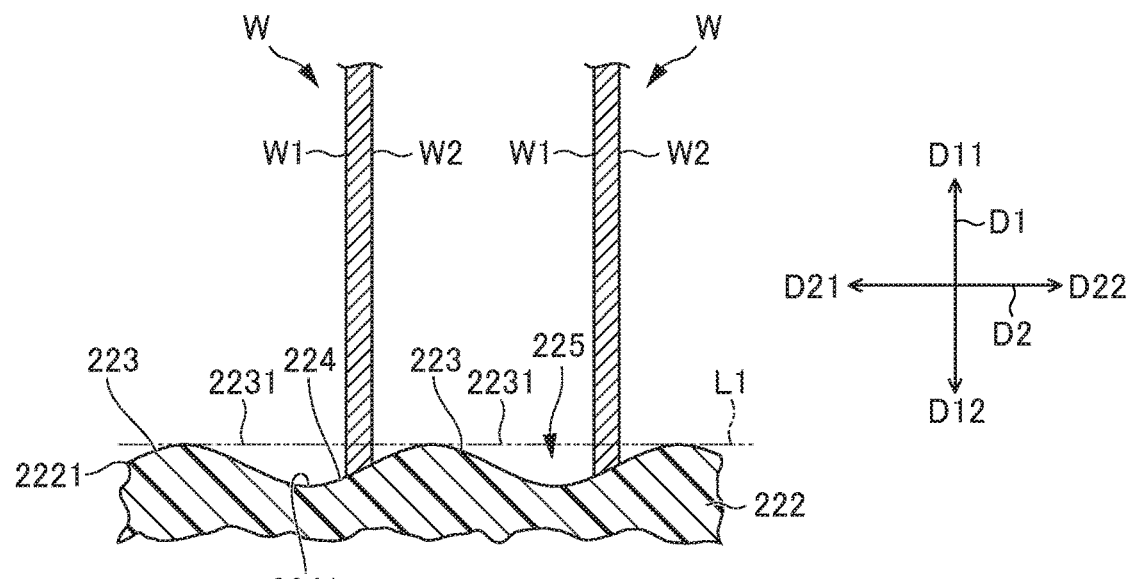
FIG. 4 is an enlarged cross-sectional view illustrating a state in which an edge portion of the substrate W abuts on a valley 224 of a substrate edge portion protective portion 222 of the substrate storing container 1 according to the first embodiment of the invention.

Hereinafter, a substrate storing container 1 according to a first embodiment will be described with reference to drawings. FIG. 1 is an exploded perspective view illustrating a state in which a substrate W is stored in the substrate storing container 1 according to the first embodiment of the invention. FIG. 2 is a planar cross-sectional view illustrating a positional relationship between the substrate storing container 1 and the substrate W according to the first embodiment of the invention. FIG. 3 is an enlarged cross-sectional view taken along A-A line of FIG. 2. FIG. 4 is an enlarged cross-sectional view illustrating a state in which an edge portion of the substrate W abuts on a valley 224 of a substrate edge portion protective portion 222 of the substrate storing container 1 according to the first embodiment of the invention.

Herein, for the purpose of illustration, the direction from a container main body 2 toward a lid body 3 (described later) (the direction from the upper right to the lower left in FIG. 1) is defined as a forward direction D11 and the direction opposite to the direction D11 is defined as a backward direction D12. Furthermore, these directions are collectively defined as a forward/backward direction D1. In addition, the direction from a lower wall 24 to an upper wall 23 (described later) (upper direction in FIG. 1) is defined as an upper direction D21 and the direction opposite to the direction D21 is defined as a lower direction D22. Furthermore, these directions are collectively defined as an upper/lower direction D2. Moreover, the direction from a second side wall 26 to a first side wall 25 (described later) (direction from the lower right to the upper left in FIG. 1) is defined as a left direction D31 and the direction opposite to the direction D31 is defined as a right direction D32. Furthermore, these directions are collectively defined as a left/right direction D3. Arrows indicating these directions are illustrated in the drawings.

Furthermore, the substrate W (refer to FIG. 1) stored in the substrate storing container 1 is a disk-like silicon wafer, glass wafer, sapphire wafer, etc., and is a thin member used for industrial use. The substrate W in the present embodiment is a silicon wafer having a diameter of 300 mm. A device is formed on a front surface W1 (a surface on the left side of the substrate W illustrated in FIG. 3) of the substrate W. No device is formed on a back surface W2 (a surface on the right side of the substrate W illustrated in FIG. 3) of the substrate W.

As illustrated in FIG. 1, the substrate storing container 1 is used as a shipping container for storing the substrate W made of the silicon wafer described above to transport the substrate W using transportation means such as land transportation means, air transportation means, marine transportation means, etc., and includes a container main body 2 and a lid body 3. The container main body 2 includes a substrate support plate-like portion 5 serving as a lateral substrate support portion and a back side substrate support portion 56 (refer to FIG. 2, etc.), and the lid body 3 includes a front retainer 7 (refer to FIG. 2, etc.) serving as a lid body side substrate support portion.

The container main body 2 has a tubular wall portion 20 in which a container main body opening portion 21 is formed at one edge portion, and in which the other edge portion is closed. A substrate storing space 27 is formed in the container main body 2. The substrate storing space 27 is formed by being surrounded by the wall portion 20. The substrate support plate-like portion 5 is disposed at a portion of the wall portion 20 corresponding to a portion forming the substrate storing space 27. As illustrated in FIG. 1, a plurality of substrates W can be stored in the substrate storing space 27.

The substrate support plate-like portion 5 is provided on the wall portion 20 so as to form a pair in the substrate storing space 27. When the container main body opening portion 21 is not closed by the lid body 3, the substrate support plate-like portion 5 can support edge portions of the plurality of substrates W in a state in which adjacent substrates W are arranged in parallel to be spaced by a predetermined interval by abutting on the edge portions of the plurality of substrates W. The back side substrate support portion 56 (refer to FIG. 2, etc.) is provided on the back side of the substrate support plate-like portion 5.

The back side substrate support portion 56 is provided on the wall portion 20 to form a pair with a front retainer 7 (described later) in the substrate storing space 27. When the container main body opening portion 21 is closed by the lid body 3, the back side substrate support portion 56 can support rear portions of the edge portions of the plurality of substrates W by abutting on the edge portions of the plurality of substrates W.

The lid body 3 is removably attached to the opening circumferential portion 28 (FIG. 1, etc.) forming the container main body opening portion 21 and can close the container main body opening portion 21. The front retainer 7 is provided at a portion of the lid body 3 which faces the substrate storing space 27 when the container main body opening portion 21 is closed by the lid body 3. The front retainer 7 is disposed so as to form a pair with the back side substrate support portion 56 in the substrate storing space 27.

When the container main body opening portion 21 is closed by the lid body 3, the front retainer 7 can support front portions of the edge portions of the plurality of substrates W by abutting on the edge portions of the plurality of substrates W. When the container main body opening portion 21 is closed by the lid body 3, the front retainer 7 retains the plurality of substrates W in a state in which adjacent substrates W are arranged in parallel to be spaced apart by a predetermined interval by supporting the plurality of substrates W in cooperation with the back side substrate support portion 56.

The substrate storing container 1 is made of a resin such as a plastic material. Unless otherwise specified, examples of the resin of the material include a thermoplastic resin such as polycarbonate, cycloolefin polymer, polyether imide, polyether ketone, polybutyl terephthalate, polyether ether ketone, or liquid crystal polymer, an ally thereof, etc. When conductivity is imparted to the resins of these molding materials, electrically conductive substances such as carbon fibers, carbon powders, carbon nanotubes, conductive polymers, etc. are selectively added. Glass fibers, carbon fibers, etc. can be added to increase the rigidity.

Hereinafter, each portion will be described in detail. As illustrated in FIG. 1, etc., the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are made of the above-mentioned material, and are configured so as to be integrally molded.

The first side wall 25 faces the second side wall 26 and the upper wall 23 faces the lower wall 24. A rear edge of the upper wall 23, a rear edge of the lower wall 24, a rear edge of the first side wall 25, and a rear edge of the second side wall 26 are all connected to the back wall 22. A front edge of the upper wall 23, a front edge of the lower wall 24, a front edge of the first side wall 25, and a front edge of the second side wall 26 have a positional relationship opposite the back wall 22, and configure the opening circumferential portion 28 which forms the container main body opening portion 21 in a substantially rectangular shape.

The opening circumferential portion 28 is provided at the one edge portion of the container main body 2, and the back wall 22 is located at the other edge portion of the container main body 2. The profile of the container main body 2 formed by the outer faces of the wall portion 20 is a box shape. Inner faces of the wall portion 20, that is, an inner face of the back wall 22, an inner face of the upper wall 23, an inner face of the lower wall 24, an inner face of the first side wall 25, and an inner face of the second side wall 26, form the substrate storing space 27, which is surrounded thereby. The container main body opening portion 21 formed by the opening circumferential portion 28 is surrounded by the wall portion 20 and is in communication with the substrate storing space 27 formed inside the container main body 2. The substrate storing space 27 can store a maximum of twenty-five substrates W.

As illustrated in FIG. 1, latch engagement concave portions 40A, 40B, 41A, and 41B, which are concave outwardly from the substrate storing space 27, are formed at portions of the upper wall 23 and the lower wall 24 which are proximal to the opening circumferential portion 28. Each of the latch engagement concave portions 40A, 40B, 41A, and 41B is respectively formed in the vicinities of both right and left edge portions of the upper wall 23 and the lower wall 24. The total number thereof is four.

As illustrated in FIG. 1, a rib 235 is provided so as to be integrally molded with the upper wall 23 at an outer face of the upper wall 23. The rib 235 increases the rigidity of the container main body 2.

A top flange 236 is fixed at a central portion of the upper wall 23. The top flange 236 becomes a member corresponding to a portion of the substrate storing container 1 from which it is hung to be suspended when suspending the substrate storing container 1 by AMHS (Automated Material Handling System), PGV (Person Guided Vehicle), etc.

A rib-shaped portion 221 is provided on the back wall 22. The rib-shaped portion 221 protrudes to the inside of the substrate storing space 27 on the inner face of the back wall 22. The substrate edge portion protective portion 222 made of the same material as that of the rib-shaped portion 221 is provided at a projecting edge portion of the rib-shaped portion 221 by being molded integrally with the rib-shaped portion 221. The substrate edge portion protective portion 222 is not limited to a configuration integrally molded with the rib-shaped portion 221, and may be made of a different material from that of the rib-shaped portion 221 and fixed to the rib-shaped portion 221 by fitting, etc.

As illustrated in FIG. 3, the front surface of the substrate edge portion protective portion 222 facing the substrate storing space 27 is corrugated, and peaks 223 and valleys 224 are alternately present along the upper/lower direction D2 in the substrate edge portion protective portion 222. Therefore, due to the peaks 223 and the valleys 224, twenty five protective grooves 225 extending substantially in the left/right direction D3 are formed in the upper/lower direction D2. Apexes of adjacent peaks 223 form openings 2231 of the protective grooves 225 and portions of bottoms of the valleys 224 form bottom portions 2241 of the protective grooves 225. The protective grooves 225 have openings 2231 wider than thicknesses of edge portions of the substrate W in the upper/lower direction D2 such that the edge portions of the substrate W can be inserted into the protective grooves 225 in a state in which the substrates W are supported by the front retainer 7 and the back side substrate support portion 56, that is, in a state in which the front surface W1 and the back surface W2 of the substrate W are in a positional relationship parallel to the forward/backward direction D1 and the left/right direction D3. When the container main body opening portion 21 is closed by the lid body 3, the edge portions of the plurality of substrates W are inserted into the protective grooves 225 one by one. In other words, when the container main body opening portion 21 is closed by the lid body 3, as illustrated in FIG. 3, the edge portions of the plurality of substrates W enters the protective grooves 225 closer to the bottom portions 2241 than a virtual line L1 connecting the openings 2231 of the protective grooves 225 one by one.

The bottom portions 2241 of the protective grooves 225 have a positional relationship in which the edge portions of the substrates W face the bottom portions 2241 of the protective grooves 225 on a radially outer side of the substrates W when the container main body opening portion 21 is closed by the lid body 3. As illustrated in FIG. 3, the protective groove 225 has a symmetric shape with respect to the bottom portion 2241 of the protective groove 225 in the upper/lower direction D2 (in the left/right direction of FIG. 3). For this reason, the edge portion of the substrate W inserted into the protective groove 225 is located at a center of each protective groove 225 in the upper/lower direction D2, and thus faces a deepest portion in each protective groove 225 (the bottom portion 2241 of the protective groove 225).

The protective groove 225 has a predetermined depth. Specifically, when the container main body opening portion 21 is not closed by the lid body 3, and thus the edge portions of the plurality of substrates W are supported by the substrate support plate-like portion 5 serving as a lateral substrate support portion, the edge portions of the substrates are not inserted into the protective grooves 225. When the container main body opening portion 21 is closed by the lid body 3, and the substrates W are supported by the front retainer 7 and the back side substrate support portion 56, the edge portions of the substrates W are inserted into the protective grooves 225 as illustrated in FIG. 3. In addition, when the container main body opening portion 21 is closed by the lid body 3, and a retainer substrate receiving portion 73 of the front retainer 7 (described later) and the substrate W are displaced by a predetermined displacement amount in the forward direction D11 corresponding to a direction from the one edge portion to the other edge portion of the container main body 2 (when displacements of the retainer substrate receiving portion 73 and the substrate W in the forward direction D11 are the maximums), a state in which the edge portion of the substrate W is inserted into the protective groove 225 is maintained. That is, when the container main body opening portion 21 is closed by the lid body 3, the edge portion of the substrate W is inserted into the protective groove 225 by an amount greater than or equal to the predetermined displacement amount. The protective groove 225 has a predetermined depth to be in such a state.

In addition, when the container main body opening portion 21 is closed by the lid body 3, and the edge portion of the substrate W is inserted into the protective groove 225, the edge portion of the substrate W does not abut on the substrate edge portion protective portion 222 forming the protective groove 225. That is, as illustrated in FIG. 3, a space is formed between the edge portion of the substrate W and a groove forming surface 2221 of the substrate edge portion protective portion 222 on which the protective groove 225 is formed. In this way, the substrate W is inserted into the protective groove 225 in a non-contact state in which the edge portion of the substrate W is not in contact with the groove forming surface 2221. The protective groove 225 has a predetermined depth to be in such a state.

As illustrated in FIG. 2, the substrate support plate-like portions 5 are provided at the first side wall 25 and the second side wall 26, respectively, and are arranged in the substrate storing space 27 so as to form a pair in the left/right direction D3. Specifically, the substrate support plate-like portion 5 includes a plate portion 51 and a plate portion support portion 52. The plate portion 51 and the plate portion support portion 52 are configured to be integrally formed by resin. The plate portion 51 has a plate-like arc shape. Twenty-five of the plate portions 51 are provided at the first side wall 25 and the second side wall 26, respectively. The total number of the plate portions 51 is fifty. The adjacent plate portions 51 are arranged so as to be spaced apart in the upper/lower direction D2 by an interval of 10 mm to 12 mm in a parallel positional relationship. It should be noted that a member of substantially the same shape as the plate portion 51 is arranged above the plate portion 51 located at the top. This is a member that serves as a guide upon inserting for the substrate W to be inserted into the substrate storing space 27 to be located at the top.

Furthermore, the twenty-five plate portions 51 provided at the first side wall 25 and the twenty-five plate portions 51 provided at the second side wall 26 have a positional relationship opposite each other in the left/right direction D3. Furthermore, the fifty plate portions 51 and two members that serve as guides having substantially the same shape as the plate portion 51 have a positional relationship parallel to an inner face of the lower wall 24. As illustrated in FIG. 2, etc., convex portions 511 and 512 are provided at an upper face of the plate portion 51. The substrate W supported by the plate portion 51 is only in contact with a projecting edge of the convex portions 511 and 512, and is not in contact with the face of the plate portion 51.

The plate portion support portion 52 extends in the upper/lower direction D2. The twenty-five plate portions 51 provided at the first side wall 25 are connected to the plate portion support portion 52 provided at the first side wall 25. Similarly, the twenty-five plate portions 51 provided at the second side wall 26 are connected to the plate portion support portion 52 provided at the second side wall 26. When the plate portion support portion 52 is fixed to each of the first side wall 25 and the second side wall 26, the substrate support plate-like portion 5 is fixed to each of the first side wall 25 and the second side wall 26.

With the substrate support plate-like portion 5 of such a configuration, it is possible to support the edge portions of the plurality of substrates W in a state in which the adjacent substrates W among the plurality of substrates W are arranged to be spaced apart by a predetermined interval in a parallel positional relationship.

As illustrated in FIG. 1, etc., the lid body 3 has a substantially rectangular shape which substantially matches the shape of the opening circumferential portion 28 of the container main body 2. The lid body 3 is removably attached to the opening circumferential portion 28 of the container main body 2. By the lid body 3 being attached to the opening circumferential portion 28, the lid body 3 can close the container main body opening portion 21. A ring-like sealing member 4 is attached to a surface corresponding to an inner face of the lid body 3 (a back side surface of the lid body 3 illustrated in FIG. 1) and facing a surface (a sealing surface 281) of a step portion formed at a position immediately in the backward direction D12 of the opening circumferential portion 28 when the lid body 3 closes the container main body opening portion 21. The sealing member 4 is made of various types of elastically deformable thermoplastic elastomer such as polyester and polyolefin, fluorine containing rubber, silicone rubber, etc. The sealing member 4 is arranged so as to go around a circumferential edge portion of the lid body 3.

When the lid body 3 is attached to the opening circumferential portion 28, the sealing member 4 is elastically deformed while being sandwiched between the sealing surface 281 and the inner face of the lid body 3, and the lid body 3 closes the container main body opening portion 21 in a sealed state. By the lid body 3 being removed from the opening circumferential portion 28, it is possible to load or unload the substrates W relative to the substrate storing space 27 in the container main body 2.

A latching mechanism is provided at the lid body 3. The latching mechanism is provided in the vicinity of both left and right end portions of the lid body 3. As illustrated in FIG. 1, the latching mechanism includes two upper side latch portions 32A and 32B which can project from an upper side of the lid body 3 in the upper direction D21 and two lower side latch portions 32C and 32D that can project from a lower side of the lid body 3 in the lower direction D22. The two upper side latch portions 32A and 32B are arranged in the vicinity of both left and right ends of the upper side of the lid body 3 and the two lower side latch portions 32C and 32D are arranged in the vicinity of both left and right ends of the lower side of the lid body 3.

An operation portion 33 is provided at an outer face of the lid body 3. By operating the operation portion 33 from the front side of the lid body 3, it is possible to cause the upper side latch portions 32A and 32B, and the lower side latch portions 32C and 32D to project from the upper side and the lower side of the lid body 3 as well as possible to make a state not projecting from the upper side and the lower side. By the upper side latch portions 32A and 32B projecting from the upper side of the lid body 3 in the upper direction D21 to engage with the latch engagement concave portions 40A and 40B of the container main body 2 and the lower side latch portions 32C and 32D projecting from the lower side of the lid body 3 in the lower direction D22 to engage with the latch engagement concave portions 41A and 41B of the container main body 2, the lid body 3 is fixed to the opening circumferential portion 28 of the container main body 2.

A concave portion (not illustrated) recessed to the outside of the substrate storing space 27 is formed on the inner side of the lid body 3 (opposite side to the outer face of the lid body 3 illustrated in FIG. 1). As illustrated in FIG. 2, a retainer locking portion 341 is provided in the concave portion (not illustrated) and a portion of the lid body 3 outside the concave portion. The front retainer 7 is fixedly provided in the retainer locking portion 341.

As illustrated in FIG. 2, the front retainer 7 includes a vertical frame body 71, a retainer leg portion 72, and a retainer substrate receiving portion 73. A pair of vertical frame bodies 71 is provided, the vertical frame body 71 has a plate shape extending in the upper/lower direction D2, and each of the vertical frame bodies 71 is fixed to the retainer locking portion 341. The retainer leg portion 72 on the left direction D31 side extends slightly in the backward direction D12 along the right direction D32 from the vertical frame body 71 on the left direction D31 side. Subsequently, the retainer leg portion 72 on the left direction D31 side curves midway and extends substantially along the backward direction D12. Subsequently, the retainer leg portion 72 on the left direction D31 side curves in the right direction D32 at an end portion on the backward direction D12 side. Further, the retainer leg portion 72 on the left direction D31 side is connected to an end of the retainer substrate receiving portion 73 on the left direction D31 side at a distal end portion thereof.

The retainer leg portion 72 on the left direction D31 side is included in an elastically deformable portion 721 particularly at a curved portion on the way. When the retainer substrate receiving portion 73 receives an external force in a direction (forward direction D11) of approaching an inner side face of the lid body 3, the elastically deformable portion 721 may displace the retainer substrate receiving portion 73 by being elastically deformed according to the external force.

Meanwhile, the retainer leg portion 72 on the right direction D32 side extends slightly in the backward direction D12 along the left direction D31 from the vertical frame body 71 on the right direction D32 side. Subsequently, the retainer leg portion 72 on the right direction D32 side curves midway and extends substantially along the backward direction D12. Subsequently, the retainer leg portion 72 on the right direction D32 side curves in the left direction D31 at an end portion on the backward direction D12 side. Further, the retainer leg portion 72 on the right direction D32 side is connected to an end of the retainer substrate receiving portion 73 on the right direction D32 side at a distal end portion thereof.

The retainer leg portion 72 on the right direction D32 side is included in an elastically deformable portion 721 at a curved portion on the way similarly to the curved portion on the way at the retainer leg portion 72 on the left direction D31 side. When the retainer substrate receiving portion 73 receives an external force in a direction (forward direction D11) of approaching the inner side face of the lid body 3, the elastically deformable portion 721 may displace the retainer substrate receiving portion 73 by being elastically deformed according to the external force.

An end on the right direction D32 side of the retainer substrate receiving portion 73 on the left direction D31 side and an end on the left direction D31 side of the retainer substrate receiving portion 73 on the right direction D32 side are connected to each other by a connecting portion 74. The connecting portion 74 immediately curves in the forward direction D11 from an end on the left direction D31 side connected to the end on the right direction D32 side of the retainer substrate receiving portion 73 on the left direction D31 side and extends substantially along the forward direction D11. Subsequently, the connecting portion 74 curves and extends substantially along the right direction D32. Subsequently, the connecting portion 74 curves again and extends substantially along the backward direction D12 this time. Then, the connecting portion 74 curves substantially in the right direction D32 at a distal end portion thereof and is connected to the end on the left direction D31 side of the retainer substrate receiving portion 73 on the right direction D32 side. The connecting portion 74 is included in the elastically deformable portion 741. That is, when the retainer substrate receiving portion 73 receives an external force in a direction (forward direction D11) of approaching the inner side face of the lid body 3, the connecting portion 74 may displace the retainer substrate receiving portion 73 by being elastically deformed according to the external force.

As described above, two retainer substrate receiving portions 73 disposed to form a pair in the left/right direction D3 are provided in a state in which 25 pairs are in parallel in the upper/lower direction D2. When the substrate W is stored in the substrate storing space 27, and the lid body 3 is closed, the retainer substrate receiving portions 73 sandwiches and supports an end edge of the edge portion of the substrate W such that the retainer substrate receiving portions 73 can be elastically displaced by a predetermined displacement amount in the forward direction D11 corresponding to a direction from the other edge portion to the one edge portion of the container main body 2. That is, when the substrate W is stored in the substrate storing space 27, and the lid body 3 is closed, the retainer substrate receiving portion 73 is slightly displaced in the forward direction D11 due to elastic deformation of the elastically deformable portions 721 and 741 of the front retainer 7. From this state, further elastic deformation is allowed by a predetermined displacement amount in the forward direction D11 or less, in other words, up to the predetermined displacement amount. Therefore, when an impact is applied to the container main body 2, the substrate W can be displaced by up to the predetermined displacement amount in the forward direction D11 together with the retainer substrate receiving portion 73. The predetermined displacement amount is about 1 mm.

When the substrate W is stored in the substrate storing container 1 according to the above configuration and conveyed, the substrate edge portion protective portion 222 operates as described below. When the container main body opening portion 21 is closed by the lid body 3, and no impact is applied to the container main body 2 or the lid body 3 of the substrate storing container 1, a portion of the peak 223 in the peak 223 and the valley 224 forming the corrugated surface of the substrate edge portion protective portion 222 enters between the edge portion of the substrate W and the edge portion of the substrate W adjacent to each other in the upper/lower direction D2, the edge portion of the substrate W is spaced from the substrate edge portion protective portion 222, and a space is formed between the edge portion of the substrate W and the substrate edge portion protective portion 222. For this reason, due to a non-contact state in which the edge portion of the substrate W does not abut on the substrate edge portion protective portion 222, no particle is generated between the edge portion of the substrate W and the substrate edge portion protective portion 222.

When an impact mainly in the upper/lower direction D2 acts on the container main body 2 or the lid body 3 of the substrate storing container 1, the edge portion of the substrate W abuts on a portion of the peak 223, and the substrate W is inhibited from moving from a portion of the opposing valley 224 to a portion of the adjacent valley 224, and generation of a so-called cross slot is suppressed.

In addition, when an impact mainly in the forward/backward direction D1 acts on the container main body 2 or the lid body 3 of the substrate storing container 1, the edge portion of the substrate W abuts on a portion of the valley 224, that is, a portion of the substrate edge portion protective portion 222 forming the bottom portion 2241 of the protective groove 225, and the edge portion of the substrate W slides along the groove forming surface 2221 to absorb the impact as illustrated in FIG. 4. In this way, the edge portion of the substrate W is inhibited from being damaged.

The substrate storing container 1 according to the embodiment having the above configuration may obtain the following effects. As described above, the substrate storing container 1 includes the container main body 2 having the tubular wall portion 20 in which the container main body opening portion 21 is formed at one edge portion and the other edge portion is closed, the substrate storing space 27 which is allowed to store the plurality of substrates W and communicates with the container main body opening portion 21 being formed by the inner face of the wall portion 20, the lid body 3 removably attached to the container main body opening portion 21 and allowed to close the container main body opening portion 21, the front retainer 7 serving as a lid body side substrate support portion disposed at a portion of the lid body 3 facing the substrate storing space 27 when the container main body opening portion 21 is closed by the lid body 3 and allowed to support the edge portions of the plurality of substrates W when the container main body opening portion 21 is closed by the lid body 3, the back side substrate support portion 56 disposed to form a pair with the front retainer 7 in the substrate storing space 27 and allowed to support the edge portions of the plurality of substrates W, the back side substrate support portion 56 supporting the plurality of substrates W in a state in which the edge portions of the plurality of substrates W are arranged in parallel in cooperation with the front retainer 7 when the container main body opening portion 21 is closed by the lid body 3, and the substrate edge portion protective portion 222 in which the plurality of protective grooves 225 having the openings wider than the thicknesses of the edge portions of the substrates W to allow insertion of the edge portions of the substrates W is formed, the edge portions of the plurality of substrates W being inserted into the plurality of protective grooves 225 one by one at least when the container main body opening portion 21 is closed by the lid body 3. The edge portions of the substrates W are inserted into the protective grooves 225 in a non-contact state in which a space is formed between the edge portions of the substrates W and the groove forming surface 2221 of the substrate edge portion protective portion 222 on which the protective grooves 225 are formed when the container main body opening portion 21 is closed by the lid body 3 and the edge portions of the substrates W are not in contact with the groove forming surface 2221.

According to this configuration, when the container main body opening portion 21 is closed by the lid body 3, a portion of the peak 223 in the portion of the peak 223 and a portion of the valley 224 forming the protective groove 225 of the substrate edge portion protective portion 222 may be disposed between adjacent substrates W among the plurality of substrates W stored in the substrate storing space 27. For this reason, when an impact is applied to the container main body 2 or the lid body 3 of the substrate storing container 1, the edge portion of the substrate W abuts on the portion of the peak 223. In this way, it is possible to prevent the edge portions of the substrates W from strongly abutting on the back wall 22 to suppress damage to the edges portions of the substrates W, and to inhibit one substrate W from moving to a portion of a valley 224 adjacent to a portion of a valley 224 facing the one substrate W, thereby suppressing generation of a so-called cross slot.

In addition, when a significantly strong impact is applied to the container main body 2 or the lid body 3 of the substrate storing container 1, the edge portion of the substrate W abuts on a portion of the valley 224 and moves to slide along the groove forming surface 2221, thereby absorbing and relieving the impact. In this way, it is possible to suppress damage to the edge portion of the substrate W.

In addition, since the edge portions of the substrates W are inserted into the protective grooves 225 in a non-contact state in which a space is formed between the edge portions of the substrates W and the groove forming surface 2221 of the substrate edge portion protective portion 222 on which the protective grooves 225 are formed when the container main body opening portion 21 is closed by the lid body 3 and the edge portions of the substrates W are not in contact with the groove forming surface 2221, it is possible to suppress generation of particles generated when the substrate edge portion protective portion 222 abuts on the edge portion of the substrate W.

In addition, the substrate storing container 1 includes the substrate support plate-like portion 5 serving as a lateral substrate support portion disposed to form a pair in the substrate storing space 27 and allowed to support the edge portions of the plurality of substrates W in a state in which adjacent substrates W among the plurality of substrates W are arranged in parallel to be spaced by a predetermined interval when the container main body opening portion 21 is not closed by the lid body 3. The protective groove 225 has a depth at which the edge portion of the substrate W is not inserted into the protective groove 225 when the container main body opening portion 21 is not closed by the lid body 3 and the edge portions of the plurality of substrates W are supported by the substrate support plate-like portion 5 and the edge portion of the substrate W is inserted into the protective groove 225 when the container main body opening portion 21 is closed by the lid body 3.

According to this configuration, when the container main body opening portion 21 is not closed by the lid body 3, the substrate edge portion protective portion 222 may be spaced from the edge portion of the substrate W, the substrate W is easily loaded in and unloaded from the substrate storing space 27, and generation of particles may be suppressed when the substrate W is loaded in and unloaded from the substrate storing space 27.

In addition, the front retainer 7 serving as a lid body side substrate support portion may be elastically displaced by a predetermined displacement amount in a direction from the other edge portion to the one edge portion of the container main body 2 when the container main body opening portion 21 is closed by the lid body 3. The protective groove 225 has a depth at which the edge portion of the substrate W is inserted into the protective groove 225 by an amount greater than or equal to a predetermined displacement amount in a direction from the one edge portion to the other edge portion of the container main body 2 when the container main body opening portion 21 is closed by the lid body 3.

According to this configuration, even though the retainer substrate receiving portion 73 is displaced in the forward direction D11 due to elastic deformation of the elastically deformable portions 721 and 741 of the front retainer 7 serving as a lid body side substrate support portion in a case in which an impact is applied to the container main body 2 or the lid body 3 of the substrate storing container 1 when the container main body opening portion 21 is closed by the lid body 3, a state in which the edge portion of the substrate W is inserted into the protective groove 225 is maintained as illustrated in FIG. 3 even in a case of displacement in a predetermined displacement amount corresponding to a maximum displacement amount. As a result, it is possible to effectively suppress generation of a so-called cross slot.

Figure 5:
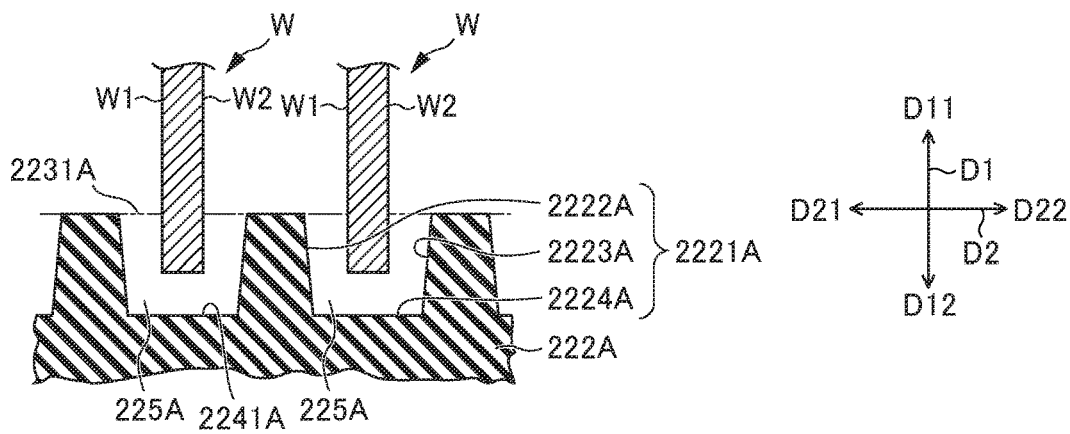
FIG. 5 is an enlarged cross-sectional view illustrating a positional relationship between a substrate W and a protective groove 225A of a substrate storing container according to a second embodiment of the invention.

Next, a substrate storing container according to a second embodiment of the invention will be described with reference to FIG. 5. FIG. 5 is an enlarged cross-sectional view illustrating a positional relationship between a substrate W and a protective groove 225A of the substrate storing container according to the second embodiment of the invention.

In the substrate storing container according to the second embodiment, a configuration of a substrate edge portion protective portion 222A is different from the substrate edge portion protective portion 222 of the substrate storing container 1 according to the first embodiment. The substrate edge portion protective portion 222A is different from the substrate edge portion protective portion 222 of the substrate storing container 1 according to the first embodiment in that the substrate edge portion protective portion 222A is made of an elastic member. Other configurations are the same as configurations of the substrate storing container 1 according to the first embodiment. Thus, the same reference symbol will be assigned to the same configuration as that of each configuration in the first embodiment and description thereof will be omitted.

The substrate edge portion protective portion 222A is preferably made of PP (polypropylene), POM (polyacetal), PBT (polybutylene terephthalate), elastomer, etc. and POM is used in the present embodiment. Therefore, the substrate edge portion protective portion 222A is more elastic than the container main body 2. The substrate edge portion protective portion 222A is made of a different material from that of the rib-shaped portion 221 (refer to FIG. 2) and fixed to the rib-shaped portion 221 by fitting, etc.

As illustrated in FIG. 5, a protective groove 225A of the substrate edge portion protective portion 222A has a substantially rectangular shape. In more detail, a groove forming surface 2221A on which the protective groove 225A is formed has a front surface facing surface portion 2222A, a back surface facing surface portion 2223A, and a bottom surface portion 2224A. The front surface facing surface portion 2222A has a positional relationship substantially parallel to a front surface W1 of the substrate W when a container main body opening portion 21 is closed by a lid body 3, and a portion of the front surface facing surface portion 2222A faces the front surface W1 in the upper/lower direction D2 corresponding to a direction connecting the front surface W1 and a back surface W2.

The back surface facing surface portion 2223A has a positional relationship substantially parallel to the back surface W2 of the substrate W when the container main body opening portion 21 is closed by the lid body 3, and a portion of the back surface facing surface portion 2223A faces the back surface W2 in the upper/lower direction D2 corresponding to a direction connecting the front surface W1 and a back surface W2. The bottom surface portion 2224A forms a bottom portion 2241A of the protective groove 225A, and is connected to each of the front surface facing surface portion 2222A and the back surface facing surface portion 2223A. As illustrated in FIG. 5, the front surface facing surface portion 2222A and the back surface facing surface portion 2223A form a pair of slightly inclined inclines such that an opening 2231A of the protective groove 225A slightly widens from the bottom portion 2241A of the protective groove 225A toward the opening 2231A.

The substrate storing container according to the embodiment having the above configuration may obtain the following effects. As described above, the groove forming surface 2221A has the front surface facing surface portion 2222A facing the front surface W1 in the direction connecting the front surface W1 and the back surface W2 when the container main body opening portion 21 is closed by the lid body 3 and the back surface facing surface portion 2223A facing the back surface W2 in the direction connecting the front surface W1 and the back surface W2 when the container main body opening portion 21 is closed by the lid body 3. Further, the protective groove 225A has a substantially rectangular shape, and the front surface facing surface portion 2222A and the back surface facing surface portion 2223A form a pair of inclined inclines such that the opening 2231A of the protective groove 225A widens from the bottom portion 2241A of the protective groove 225A toward the opening 2231A. According to this configuration, it is possible to easily maintain a state in which the substrate W is inserted into the substantially rectangular protective groove 225A, and to more effectively suppress generation of a so-called cross slot.

In addition, the substrate edge portion protective portion 222A has elasticity. According to this configuration, when the edge portion of the substrate W abuts on the substrate edge portion protective portion 222A, the substrate edge portion protective portion 222A may relieve an impact by being elastically deformed to receive the edge portion of the substrate W, and the edge portion of the substrate W may be inhibited from being damaged. In addition, when the edge portion of the substrate W abuts on the substrate edge portion protective portion 222A, the edge portion of the substrate W may be brought into the substrate edge portion protective portion 222A. As a result, it is possible to more effectively suppress generation of a so-called cross slot. In addition, referring to the protective groove 225A of the present embodiment, besides an elastic body, it is possible to adopt appropriate modifications such as integral formation using the same material as that of the container main body as in the first embodiment, attachment of another member using the same material, formation using a different material from that of the container main body, etc. within the scope of claims.

Figure 6:
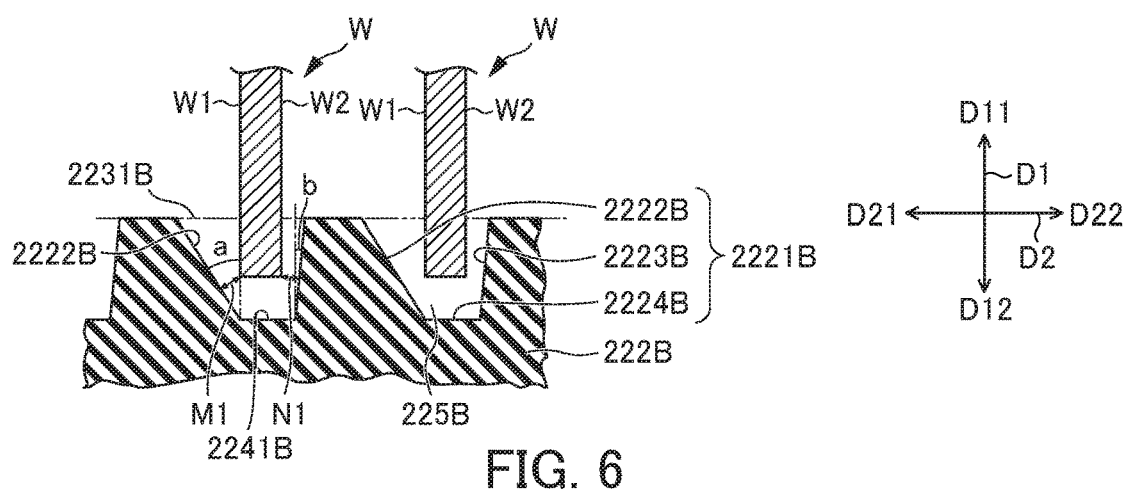
FIG. 6 is an enlarged cross-sectional view illustrating a positional relationship between a substrate W and a protective groove 225B of a substrate storing container according to a third embodiment of the invention.

Next, a substrate storing container according to a third embodiment of the invention will be described with reference to FIG. 6. FIG. 6 is an enlarged cross-sectional view illustrating a positional relationship between a substrate W and a protective groove 225B of the substrate storing container according to the third embodiment of the invention.

In the substrate storing container according to the third embodiment, a configuration of a substrate edge portion protective portion 222B is different from the substrate edge portion protective portion 222A of the substrate storing container according to the second embodiment. Other configurations are the same as configurations of the substrate storing container according to the second embodiment. Thus, the same reference symbol will be assigned to the same configuration as that of each configuration in the second embodiment and description thereof will be omitted.

As illustrated in FIG. 6, when compared to a back surface facing surface portion 2223B, a front surface facing surface portion 2222B of a groove forming surface 2221B on which the protective groove 225B is formed is included in an incline inclined such that an opening 2231B of the protective groove 225B further widens from a bottom portion 2241B (bottom surface portion 2224B) of the protective groove 225B toward the opening 2231B. When an angle between a front surface W1 of the substrate W and the front surface facing surface portion 2222B is set to a, and an angle between the front surface W1 of the substrate W and the back surface facing surface portion 2223B is set to b,
a relation of a>b
is satisfied. Therefore, a shortest distance M1 from the front surface W1 of the substrate W on which a device is formed to the front surface facing surface portion 2222B is longer than a shortest distance N1 from the back surface W2 to the back surface facing surface portion 2223B.

The substrate storing container according to the embodiment having the above configuration may obtain the following effects. As described above, when an angle between the front surface W1 of the substrate W and the front surface facing surface portion 2222B is set to a, and an angle between the front surface W1 of the substrate W and the back surface facing surface portion 2223B is set to b,
a relation of a>b
is satisfied. Further, the shortest distance M1 from the front surface W1 to the front surface facing surface portion 2222B is longer than the shortest distance N1 from the back surface W2 to the back surface facing surface portion 2223B. According to this configuration, the front surface facing surface portion 2222B may be spaced from the front surface W1 on which the device is formed as much as possible. As a result, it is possible to suppress an adverse effect on the front surface W1 of the substrate W on which the device is formed due to particles released from the front surface facing surface portion 2222B. In addition, referring to the protective groove 225B of the present embodiment, besides an elastic body in the second embodiment, it is possible to adopt appropriate modifications such as integral formation using the same material as that of the container main body as in the first embodiment, attachment of another member using the same material, formation using a different material from that of the container main body, etc. within the scope of claims.

Figure 7:
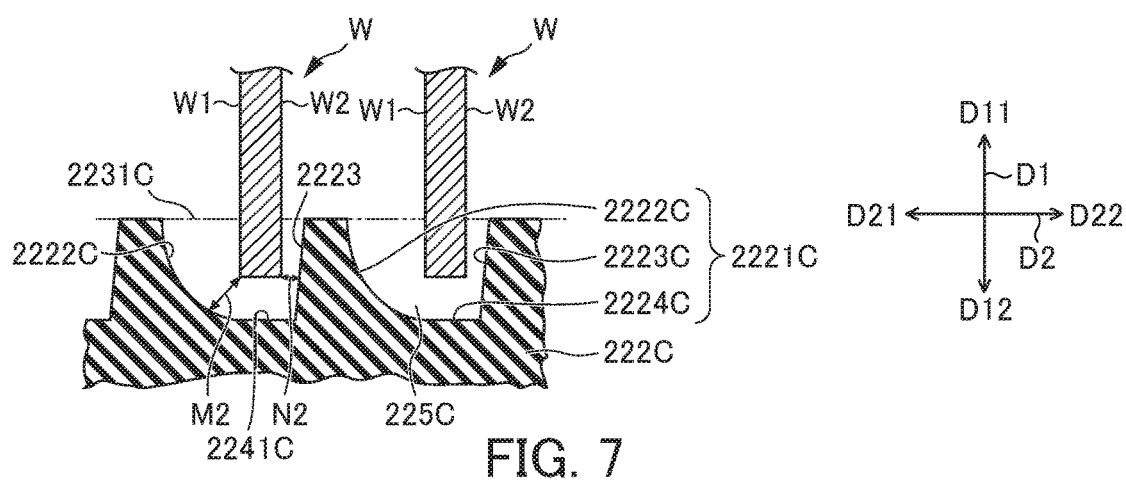
FIG. 7 is an enlarged cross-sectional view illustrating a positional relationship between a substrate W and a protective groove 225C of a substrate storing container according to a fourth embodiment of the invention.

Next, a substrate storing container according to a fourth embodiment of the invention will be described with reference to FIG. 7. FIG. 7 is an enlarged cross-sectional view illustrating a positional relationship between a substrate W and a protective groove 225C of the substrate storing container according to the fourth embodiment of the invention.

In the substrate storing container according to the fourth embodiment, a configuration of a substrate edge portion protective portion 222C is different from the substrate edge portion protective portion 222B of the substrate storing container according to the third embodiment. Other configurations are the same as configurations of the substrate storing container according to the third embodiment. Thus, the same reference symbol will be assigned to the same configuration as that of each configuration in the third embodiment and description thereof will be omitted.

As illustrated in FIG. 7, a front surface facing surface portion 2222C of a groove forming surface 2221C on which the protective groove 225C is formed has a curved surface. The front surface facing surface portion 2222C gently rises from a bottom surface portion 2224C (a bottom portion 2241C of the protective groove 225C), gradually curves to approach a horizontal surface (a surface parallel to the forward/backward direction D1 and the left/right direction D3), and extends up to an opening 2231C of the protective groove 225C. Since the front surface facing surface portion 2222C has such a shape, a shortest distance M2 from the front surface W1 of the substrate W on which the device is formed to the front surface facing surface portion 2222C is longer than the shortest distance N2 from the back surface W2 to the back surface facing surface portion 2223C.

The substrate storing container according to the embodiment having the above configuration may obtain the following effects. The front surface facing surface portion 2222C of the groove forming surface 2221C on which the protective groove 225C is formed has a curved surface, gently rises from the bottom surface portion 2224C, gradually curves to approach the horizontal surface, and extends up to the opening 2231C of the protective groove 225C. According to this configuration, it is possible to ensure the longer shortest distance M2 from the front surface W1 of the substrate W on which the device is formed to the front surface facing surface portion 2222C. In addition, referring to the protective groove 225C of the present embodiment, besides an elastic body in the second embodiment or the third embodiment, it is possible to adopt appropriate modifications such as integral formation using the same material as that of the container main body as in the first embodiment, attachment of another member using the same material, formation using a different material from that of the container main body, etc. within the scope of claims.

The invention is not limited to the above-described embodiments, and may be modified within the technical scope described in the claims. For example, even though the present embodiment is configured such that the edge portion of the substrate W is not inserted into the protective groove 225 when the container main body opening portion 21 is not closed by the lid body 3, and the edge portion of the substrate W is inserted into the protective groove 225 when the container main body opening portion 21 is closed by the lid body 3, the invention is not limited thereto. The edge portions of the plurality of substrates may be inserted one by one when at least the container main body opening portion is closed by the lid body.

In addition, even though each of the front surface facing surface portions 2222A and 2222B and each of the back surface facing surface portions 2223A and 2223B are included in a pair of inclines inclined such that the openings 2231A and 2231B of the protective grooves 225A and 225B widen from the bottom portions 2241A and 2241B of the protective grooves 225A and 225B toward the openings 2231A and 2231B in the second embodiment and the third embodiment, the invention is not limited to this configuration. The front surface facing surface portion and the back surface facing surface portion may be included in at least a pair of inclines inclined such that the opening of the protective groove widens from the bottom portion of the protective groove toward the opening.

In addition in the third embodiment, when an angle between the front surface W1 of the substrate W and the front surface facing surface portion 2222B is set to a, and an angle between the front surface of the substrate and the back surface facing surface portion 2223B is set to b, a relation of a>b is satisfied. However, the invention is not limited to this configuration. For example, when an angle between the back surface of the substrate and the front surface facing surface portion is set to a, and an angle between the back surface of the substrate and the back surface facing surface portion is set to b, a relation of a>b may be satisfied.

In addition, in the present embodiment, the front surface W1 of the substrate W on which the device is formed is set to the upper face, and the back surface W2 of the substrate W on which the device is not formed is set to the lower face. However, the invention is not limited thereto. For example, the front surface W1 of the substrate W may be set to the lower surface, and the back surface W2 of the substrate W on which the device is not formed may be set to the upper face. However, in this case, the protective groove has a positional relationship in which the front surface facing surface portion is located below the back surface facing surface portion (for example, the protective grooves 225B and 225C illustrated in FIG. 6 and FIG. 7 have a left-right opposite positional relationship in FIG. 6 and FIG. 7 such that the front surface facing surface portions 2222B and 2222C are located on the right side of the back surface facing surface portions 2223B and 2223C in FIG. 6 and FIG. 7).

In addition, the shapes of the container main body and the lid body, and the number or dimensions of substrates W storable in the container main body are not limited to the shapes of the container main body 2 and the lid body 3, and the number or dimensions of substrates W storable in the container main body 2 in the present embodiment. For example, even though the substrate W in the present embodiment corresponds to a silicon wafer having a diameter of 300 mm in the present embodiment, the invention is not limited thereto. The substrate may correspond to a silicon wafer having a diameter of 450 mm.

EXPLANATION OF REFERENCE NUMERALS 1 substrate storing container
2 container main body
3 lid body
5 substrate support plate-like portion
7 front retainer (lid body side substrate support portion)
20 wall portion
21 container main body opening portion
27 substrate storing space
56 back side substrate support portion
222, 222A, 222B, 222C substrate edge portion protective portion
225, 225A, 225B, 225C protective groove
2221, 2221A, 2221B, 2221C groove forming surface
2222, 2222A, 2222B, 2222C front surface facing surface portion
2223, 2223A, 2223B, 2223C back surface facing surface portion
2231, 2231A, 2231B, 2231C opening
2241, 2241A, 2241B, 2241C bottom portion
M1, M2 shortest distance from front surface to front surface facing surface portion
N1, N2 shortest distance from back surface to back surface facing surface portion W substrate
W1 front surface
W2 back surface

The invention claimed is:

1. A substrate storing container comprising:
a container main body having a tubular wall portion in which a container main body opening portion is formed at one edge portion and the other edge portion is closed, a substrate storing space which is allowed to store a plurality of substrates and communicates with the container main body opening portion being formed by an inner face of the wall portion;
a lid body removably attached to the container main body opening portion and allowed to close the container main body opening portion;
a lid body side substrate support portion disposed at a portion of the lid body facing the substrate storing space when the container main body opening portion is closed by the lid body and allowed to support edge portions of the plurality of substrates when the container main body opening portion is closed by the lid body;
a back side substrate support portion disposed to form a pair with the lid body side substrate support portion in the substrate storing space and allowed to support the edge portions of the plurality of substrates, the back side substrate support portion supporting the plurality of substrates in a state in which the edge portions of the plurality of substrates are arranged in parallel in cooperation with the lid body side substrate support portion when the container main body opening portion is closed by the lid body; and
a substrate edge portion protective portion in which a plurality of protective grooves having valleys between peaks and openings wider than thicknesses of the edge portions of the substrates to allow insertion of the edge portions of the substrates is formed, the edge portions of the plurality of substrates being inserted into the plurality of protective grooves one by one at least when the container main body opening portion is closed by the lid body,
wherein the edge portions of the substrates are inserted into the protective grooves beyond a line between adjacent peaks in a non-contact state in which a space is formed between the edge portions of the substrates and the groove forming surface of the substrate edge portion protective portion on which the protective grooves are formed when the container main body opening portion is closed by the lid body and the edge portions of the substrates are not in contact with the groove forming surface.

2. The substrate storing container according to claim 1, further comprising:
a lateral substrate support portion disposed to form a pair in the substrate storing space and allowed to support the edge portions of the plurality of substrates in a state in which adjacent substrates among the plurality of substrates are arranged in parallel to be spaced by a predetermined interval when the container main body opening portion is not closed by the lid body,
wherein the protective grooves have depths at which the edge portions of the substrates are not inserted into the protective grooves when the container main body opening portion is not closed by the lid body and the edge portions of the plurality of substrates are supported by the lateral substrate support portion and the edge portions of the substrates are inserted into the protective grooves when the container main body opening portion is closed by the lid body.

3. The substrate storing container according to claim 1, wherein each of the substrates has a front surface on which a device is formed and a back surface with respect to the front surface,
the groove forming surface has a front surface facing surface portion facing the front surface in a direction connecting the front surface and the back surface when the container main body opening portion is closed by the lid body, and a back surface facing surface portion facing the back surface in a direction connecting the front surface and the back surface when the container main body opening portion is closed by the lid body, and
a shortest distance from the front surface to the front surface facing surface portion is longer than a shortest distance from the back surface to the back surface facing surface portion.

4. The substrate storing container according to claim 3, wherein the front surface facing surface portion and the back surface facing surface portion are included in at least a pair of inclines inclined such that each of the openings of each of the protective grooves widens from a bottom portion of the protective groove toward the opening,
when an angle between one of the front surface and the back surface of the substrate and the front surface facing surface portion is set to a, and an angle between the one surface of the substrate and the back surface facing surface portion is set to b,
a relation of $a > b$
is satisfied, and
the edge portions of the substrates face bottom portions of the protective grooves on a radially outer side of the substrates when the container main body opening portion is closed by the lid body.

5. The substrate storing container according to claim 1, wherein the lid body side substrate support portion is allowed to be elastically displaced by a predetermined displacement amount in a direction from the other edge portion to the one edge portion of the container main body when the container main body opening portion is closed by the lid body, and
the protective grooves have depths at which the edge portions of the substrates are inserted into the protective grooves by an amount greater than or equal to the predetermined displacement amount in a direction from the one edge portion to the other edge portion of the container main body when the container main body opening portion is closed by the lid body.

6. The substrate storing container according to claim 1, wherein the substrate edge portion protective portion has elasticity.

* * * * *